(12) United States Patent
Kim et al.

(10) Patent No.: US 11,937,456 B2
(45) Date of Patent: Mar. 19, 2024

(54) DISPLAY APPARATUS

(71) Applicant: Samsung Display Co., Ltd., Yongin-si (KR)

(72) Inventors: Kiwook Kim, Yongin-si (KR); Chulkyu Kang, Yongin-si (KR); Wonkyu Kwak, Yongin-si (KR); Kwangmin Kim, Yongin-si (KR); Joongsoo Moon, Giheung-gu (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 374 days.

(21) Appl. No.: 17/322,257

(22) Filed: May 17, 2021

(65) Prior Publication Data
US 2021/0273032 A1 Sep. 2, 2021

Related U.S. Application Data

(63) Continuation of application No. 16/369,615, filed on Mar. 29, 2019, now Pat. No. 11,011,594.

(30) Foreign Application Priority Data

Mar. 29, 2018 (KR) .......................... 10-2018-0036609

(51) Int. Cl.
H10K 59/121 (2023.01)
G09G 3/3266 (2016.01)
(Continued)

(52) U.S. Cl.
CPC ....... H10K 59/1213 (2023.02); G09G 3/3266 (2013.01); G09G 3/3291 (2013.01);
(Continued)

(58) Field of Classification Search
CPC ......... G09G 2300/0426; G09G 3/3266; G09G 3/3291; H01L 27/1214; H01L 27/1222;
(Continued)

(56) References Cited

U.S. PATENT DOCUMENTS 9,455,279 B2 9/2016 Cho et al.
2005/0167673 A1 8/2005 Maegawa et al.
(Continued)

FOREIGN PATENT DOCUMENTS

CN 107507841 12/2017
GB 2536148 9/2016
(Continued)

OTHER PUBLICATIONS

Partial European Search Report corresponding to European Patent Application or Patent No. 19166148.7, dated Aug. 29, 2019.
(Continued)

Primary Examiner — Mohammad M Hoque
Assistant Examiner — Kevin Quinto
(74) Attorney, Agent, or Firm — KILE PARK REED & HOUTTEMAN PLLC

(57) ABSTRACT

A display apparatus includes a substrate including a display area for displaying an image, a first thin film transistor in the display area and including a first semiconductor layer having a silicon semiconductor and a first gate electrode insulated from the first semiconductor layer, a first interlayer insulating layer covering the first gate electrode and having a first contact hole extending therethrough, and a second thin film transistor on the first interlayer insulating layer and including a second semiconductor layer having an oxide semiconductor and a second gate electrode insulated from the second semiconductor layer. A portion of the second semiconductor layer extends into a first contact hole and is electrically connected to the first semiconductor layer.

10 Claims, 10 Drawing Sheets

(51) Int. Cl.
  *G09G 3/3291* (2016.01)
  *H01L 27/12* (2006.01)
  *H10K 59/131* (2023.01)
  *H01L 29/786* (2006.01)

(52) U.S. Cl.
  CPC ...... *H01L 27/1222* (2013.01); *H01L 27/1225* (2013.01); *H01L 27/124* (2013.01); *H10K 59/1216* (2023.02); *H10K 59/131* (2023.02); *G09G 2300/0426* (2013.01); *H01L 29/78651* (2013.01); *H01L 29/7869* (2013.01)

(58) Field of Classification Search
  CPC .............. H01L 27/1225; H01L 27/124; H01L 27/1248; H01L 27/1251; H01L 27/1255; H01L 29/78651; H01L 29/7869; H10K 59/1213; H10K 59/1216; H10K 59/131
  See application file for complete search history.

(56) References Cited

U.S. PATENT DOCUMENTS

| | | | |
|---|---|---|---|
| 2005/0264228 A1* | 12/2005 | Kim | H01L 27/1255 257/E27.113 |
| 2013/0015448 A1 | 1/2013 | Yang et al. | |
| 2015/0108454 A1 | 4/2015 | Kim | |
| 2016/0064421 A1 | 3/2016 | Oh et al. | |
| 2016/0087021 A1 | 3/2016 | Sato | |
| 2016/0111450 A1 | 4/2016 | Shen et al. | |
| 2016/0260754 A1 | 9/2016 | Sun et al. | |
| 2016/0372497 A1 | 12/2016 | Lee et al. | |
| 2017/0256569 A1 | 9/2017 | Ohara | |
| 2017/0278869 A1 | 9/2017 | Hiramatsu et al. | |
| 2017/0338252 A1 | 11/2017 | Lee et al. | |
| 2018/0033805 A1 | 2/2018 | Gupta et al. | |
| 2018/0366586 A1 | 12/2018 | Son et al. | |
| 2019/0096920 A1 | 3/2019 | Zhou et al. | |

FOREIGN PATENT DOCUMENTS

| | | |
|---|---|---|
| KR | 10-2005-0113694 | 12/2005 |
| KR | 10-2015-0044724 | 4/2015 |
| KR | 10-2015-0081869 | 7/2015 |
| KR | 10-2015-0100566 | 9/2015 |
| KR | 10-2015-0101409 | 9/2015 |
| KR | 10-2016-0043327 | 4/2016 |
| KR | 10-1700388 | 1/2017 |
| KR | 10-2018-0137640 | 12/2018 |

OTHER PUBLICATIONS

Partial European Search Report for European Application No. 23152947.0, dated May 12, 2023.
Extended European Search Report for European Patent Application No. 23152947.0, dated Sep. 25, 2023.

* cited by examiner

DISPLAY APPARATUS

CROSS-REFERENCE TO RELATED APPLICATION(S)

This is a continuation application of U.S. patent application Ser. No. 16/369,615 filed Mar. 29, 2019 (now pending), the disclosure of which is incorporated herein by reference in its entirety. U.S. patent application Ser. No. 16/369,615 claims priority benefit of Korean Patent Application 10-2018-0036609 filed Mar. 29, 2018 in the Korean Intellectual Property Office, the disclosure of which is incorporated herein by reference in its entirety for all purposes.

BACKGROUND

1. Field

One or more embodiments relate to a display apparatus, and more particularly, to a display apparatus driven by a thin film transistor (TFT) including a silicon semiconductor and a TFT including an oxide semiconductor.

2. Description of the Related Art

In general, display apparatuses include a display device and a driving circuit for controlling an electrical signal applied to the display device. A driving circuit includes a TFT, a storage capacitor, and a plurality of wirings. In order to accurately control light emission of a display device and a degree of light emission, the number of TFTs electrically connected to one display device has increased. Accordingly, solutions to increase integration and reduce power consumption of a display apparatus are needed.

SUMMARY

According to one or more embodiments, a display apparatus includes a substrate including a display area for displaying an image, a first thin film transistor in the display area and including a first semiconductor layer including a silicon semiconductor and a first gate electrode insulated from the first semiconductor layer, a first interlayer insulating layer covering the first gate electrode, and a second thin film transistor on the first interlayer insulating layer and including a second semiconductor layer including an oxide semiconductor and a second gate electrode insulated from the second semiconductor layer, in which a portion of the second semiconductor layer extends into a first contact hole and connected to the first semiconductor layer, the first contact hole penetrating through the first interlayer insulating layer.

The first semiconductor layer may include a first channel area, and a first source area and a first drain area respectively at both sides of the first channel area and doped with impurities. The second semiconductor layer may include a second channel area, and a second source area and a second drain area respectively at both sides of the second channel area and made to be conductive. One of the second source area and second drain area may extend into the first contact hole and contact one of the first source area and the first drain area.

The display apparatus may further include a first gate insulating layer between the first semiconductor layer and the first gate electrode, wherein the first contact hole penetrates through the first interlayer insulating layer and the first gate insulating layer and exposes a part of the first semiconductor layer.

The display apparatus may further include a storage capacitor to overlap the first thin film transistor, wherein the storage capacitor includes a lower electrode, an upper electrode to overlap the lower electrode, and a second gate insulating layer between the lower electrode and the upper electrode, and the lower electrode is integral with the first gate electrode.

The display apparatus may further include a second interlayer insulating layer on the second gate electrode, and a node connection line on the second interlayer insulating layer, wherein the node connection line extends into a second contact hole and connected to the first gate electrode, the second contact hole penetrating through the second interlayer insulating layer and the first interlayer insulating layer.

The display apparatus may further include a third thin film transistor on a same layer as the first semiconductor layer and including a third semiconductor layer including a silicon semiconductor and a third gate electrode insulated from the third semiconductor layer, a second interlayer insulating layer on the second gate electrode, and a connection electrode on the second interlayer insulating layer, wherein the connection electrode extends into a third contact hole and is electrically connected to the third semiconductor layer, the third contact hole penetrating through the second interlayer insulating layer and the first interlayer insulating layer.

The display apparatus may further include a second gate insulating layer covering the first gate electrode, and a first lower connection electrode on the second gate insulating layer, wherein the first lower connection electrode extends into a first lower contact hole and electrically connected to the first semiconductor layer, the first lower contact hole penetrating through the second gate insulating layer, and a part of the second semiconductor layer extends into the first contact hole and contacts the first lower connection electrode.

The display apparatus may further include a storage capacitor using the first gate electrode as a lower electrode and an upper electrode on the second gate insulating layer to overlap the first gate electrode, wherein the first lower connection electrode includes a same material as an upper electrode and is on a same layer as the upper electrode, and the first contact hole and the first lower contact hole overlap.

The display apparatus may further include a second lower connection electrode on the first interlayer insulating layer and including a same material as the second semiconductor layer, a second interlayer insulating layer on the second gate electrode, and a node connection line on the second interlayer insulating layer, wherein the second lower connection electrode extends into a second lower contact hole and is connected to the first gate electrode, the second lower contact hole penetrating through the first interlayer insulating layer, and the node connection line extends into a second upper contact hole and connected to the second lower connection electrode, the second upper contact hole penetrating through the second interlayer insulating layer.

The second lower contact hole and the second upper contact hole may overlap.

The display apparatus may further include a third thin film transistor on a same layer as the first semiconductor layer and including a third semiconductor layer including a silicon semiconductor and a third gate electrode insulated from the third semiconductor layer, a third lower connection electrode on the first interlayer insulating layer and including a same material as the second semiconductor layer, a second interlayer insulating layer on the second gate electrode, and a connection electrode on the second interlayer insulating layer, wherein the third lower connection electrode extends into a third lower contact hole and electrically connected to the third semiconductor layer, the third lower contact hole penetrating through the third semiconductor layer, and the connection electrode extends into a third upper contact hole of the second interlayer insulating layer and electrically connected to the third lower connection electrode.

The third lower contact hole and the third upper contact hole may overlap.

The display apparatus may further include a second interlayer insulating film covering the second gate electrode, a voltage driving line on the second interlayer insulating film, and a first planarized layer covering the voltage driving line.

The display apparatus may further include an organic light-emitting device on the first planarized layer and including a pixel electrode, an intermediate layer including an organic emission layer, and an opposite electrode, which are sequentially stacked.

The display apparatus may further include an upper wiring on the first planarized layer, a second planarized layer covering the upper wiring, and an organic light-emitting device on the second planarized layer and including a pixel electrode, an intermediate layer including an organic emission layer, and an opposite electrode, which are sequentially stacked.

According to one or more embodiments, in a display apparatus for displaying an image by including a plurality of pixels on a substrate, each of the plurality of pixels include a first thin film transistor on the substrate and including a first semiconductor layer including a silicon semiconductor and a first gate electrode insulated from the first semiconductor layer by a first gate insulating layer, a first interlayer insulating layer covering the first gate electrode, and a second thin film transistor on the first interlayer insulating layer and including a second semiconductor layer including an oxide semiconductor and a second gate electrode insulated from the second semiconductor layer by a third gate insulating layer, wherein a portion of the second semiconductor layer extends into a first contact hole and electrically connected to the first semiconductor layer, the first contact hole penetrating through the first semiconductor layer.

A width of the third gate insulating layer in a direction may be substantially the same as a width of the second gate electrode in the direction.

The first semiconductor layer may include a first source area and a first drain area, which are doped with impurities, and the first contact hole may penetrate through the first interlayer insulating layer and the first gate insulating layer and expose one of the first source area and the first drain area.

The second semiconductor layer may include a second source area and a second drain area, which are made to be conductive, and one of the second source area and the second drain area may extend into the first contact hole.

The display apparatus may further include a storage capacitor to overlap the first thin film transistor, wherein the storage capacitor includes a lower electrode, an upper electrode to overlap the lower electrode, and a second gate insulating layer between the lower electrode and the upper electrode, and the lower electrode is integral with the first gate electrode.

The display apparatus may further include a second interlayer insulating layer covering the second gate electrode, a node connection line on the second interlayer insulating layer, and a second contact hole penetrating through the second interlayer insulating layer, the first interlayer insulating layer, and the second gate insulating layer, wherein the node connection line extends into the second contact hole and contacts the first gate electrode, the upper electrode includes a storage opening portion having a single closed curve shape, and the second contact hole is in the storage opening portion.

The display apparatus may further include a third thin film transistor on a same layer as the first semiconductor layer and including a third semiconductor layer including a silicon semiconductor and a third gate electrode insulated from the third semiconductor layer by the first gate insulating layer, a second interlayer insulating layer on the second gate electrode, a connection electrode on the second interlayer insulating layer, and an organic light-emitting device connected to the connection electrode, wherein the connection electrode extends into a third contact hole and electrically connected to the third semiconductor layer, the third contact hole penetrating through the second interlayer insulating layer and the first interlayer insulating layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
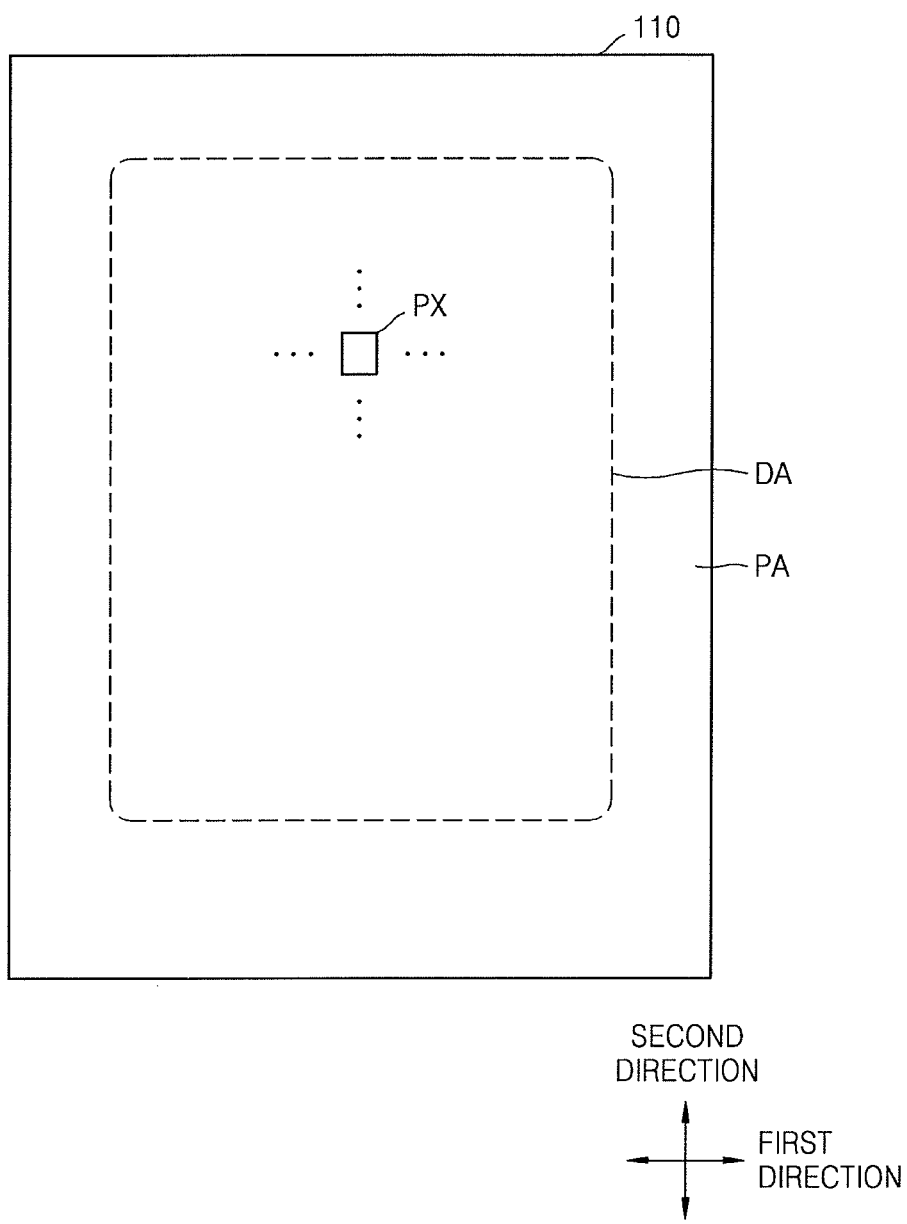
FIG. 1 illustrates a schematic view of a display apparatus according to an embodiment.

Advantages and features of the present disclosure and methods of accomplishing the same may be understood more readily by reference to the following detailed description of exemplary embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the disclosure to those of ordinary skill in the art, and the present disclosure will only be defined by the appended claims. In some embodiments, well-known processes, well-known structures and well-known technologies will not be specifically described in order to avoid ambiguous interpretation of the present disclosure. Like reference numerals refer to like elements throughout the specification. In the following description, when detailed descriptions about related well-known functions or structures are determined to make the gist of the present disclosure unclear, the detailed descriptions will be omitted herein.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected to" another layer, region, or component, it can be directly connected to the other layer, region, or component or indirectly connected to the other layer, region, or component via intervening layers, regions, or components. For example, in the present specification, when a layer, region, or component is referred to as being electrically connected to another layer, region, or component, it can be directly electrically connected to the other layer, region, or component or indirectly electrically connected to the other layer, region, or component via intervening layers, regions, or components.

FIG. 1 is a view schematically illustrating a display apparatus according to an embodiment. A plurality of pixels PX including various display devices such as an organic light-emitting device (OLED) may be arranged in a display area DA of a substrate 110. A variety of wirings for transmitting electrical signals to the display area DA may be in a peripheral area (PA) of the substrate 110. In the following description, for convenience of explanation, a display apparatus having an OLED is described as a display device. Alternatively, the wirings herein may be applied to various types of display apparatuses, e.g., a liquid crystal display, an electrophoretic display, an inorganic EL display, and the like.

Figure 2:
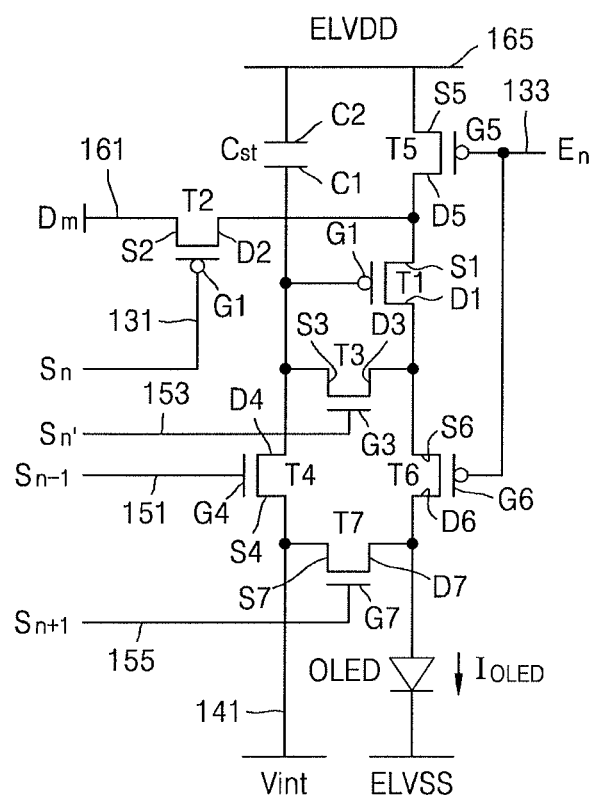
FIG. 2 illustrates an equivalent circuit diagram of a pixel in the display apparatus of FIG. 1.

FIG. 2 is an equivalent circuit diagram of one of the pixels PX in the display apparatus of FIG. 1. Referring to FIG. 2, one of the pixels PX may include a plurality of signal lines 131, 133, 151, 153, 155, and 161, a plurality of thin film transistors (TFTs) T1, T2, T3, T4, T5, T6, and T7 connected to the signal lines 131, 133, 151, 153, 155, and 161, a storage capacitor Cst, an initialization voltage line 141, a driving voltage line 165, and the OLED.

FIG. 2 illustrates a case in which the signal lines 131, 133, 151, 153, 155, and 161, the initialization voltage line 141, and the driving voltage line 165 are provided for each pixel PX. Alternatively, at least one of the signal lines 131, 133, 151, 153, 155, and 161, the initialization voltage line 141, and/or the driving voltage line 165 may be shared by neighboring pixels.

The TFTs T1, T2, T3, T4, T5, T6, and T7 may include a driving TFT T1, a switching TFT T2, a compensation TFT T3, a first initialization TFT T4, an operation control TFT T5, an emission control TFT T6, and a second initialization TFT T7.

FIG. 2 illustrates that, among the TFTs T1, T2, T3, T4, T5, T6, and T7, the compensation TFT T3, the first initialization TFT T4, and the second initialization TFT T7 are an n-channel MOSFET (NMOS) TFT, and the other TFTs are a p-channel MOSFET (PMOS) TFT. Alternatively, among the TFTs T1, T2, T3, T4, T5, T6, and T7, the compensation TFT T3 and the first initialization TFT T4 may be an NMOS TFT, and the others may be a PMOS TFT. As a further alternative, only one of the TFTs T1, T2, T3, T4, T5, T6, and T7 may be an NMOS TFT and the others may be a PMOS TFT, or all of the TFTs T1, T2, T3, T4, T5, T6, and T7 may be an NMOS TFT.

The signal lines 131, 133, 151, 153, 155, and 161 may include a first scan line 131 for transmitting a first scan signal $S_n$ to the switching TFT T2, a second scan line 153 for transmitting a second scan signal $S_{n'}$ to the compensation TFT T3, a previous scan line 151 for transmitting a previous scan signal $S_{n-1}$ to the first initialization TFT T4, an emission control line 133 for transmitting an emission control signal $E_n$ to the operation control TFT T5 and the emission control TFT T6, a next scan line 155 for transmitting a next scan signal $S_{n+1}$ to the second initialization TFT T7, and a data line 161 for transmitting a data signal $D_m$ to the switching TFT T2. The data line 161 and the first scan line 131 intersect.

The driving voltage line 165 transmits a driving voltage ELVDD to the driving TFT T1. The initialization voltage line 141 transmits an initialization voltage Vint to initialize the driving TFT T1 and a pixel electrode (see 310 of FIG. 4).

A driving gate electrode G1 of the driving TFT T1 is connected to a lower electrode C1 of the storage capacitor Cst. A driving source electrode S1 of the driving TFT T1 is connected to the driving voltage line 165 via the operation control TFT T5. A driving drain electrode D1 of the driving TFT T1 is electrically connected to a pixel electrode of the OLED via the emission control TFT T6. According to a switching operation of the switching TFT T2, the driving TFT T1 receives the data signal $D_m$ and supplies a driving current IOLED to the OLED.

A switching gate electrode G2 of the switching TFT T2 is connected to the first scan line 131. A switching source electrode S2 of the switching TFT T2 is connected to the data line 161. A switching drain electrode D2 of the switching TFT T2 is connected to the driving source electrode S1 of the driving TFT T1 and to the driving voltage line 165 via the operation control TFT T5. The switching TFT T2 is turned on by the first scan signal $S_n$ received through the first scan line 131 and performs the switching operation of transmitting the data signal $D_m$ received through the data line 161 to the driving source electrode S1 of the driving TFT T1.

A compensation gate electrode G3 of the compensation TFT T3 is connected to the second scan line 153. A compensation drain electrode D3 of the compensation TFT T3 is connected to the driving drain electrode D1 of the driving TFT T1 and is connected to the pixel electrode of the OLED via the emission control TFT T6. A compensation source electrode S3 of the compensation TFT T3 is connected to the lower electrode C1 of the storage capacitor Cst, a first initialization drain electrode D4 of the first initialization TFT T4, and the driving gate electrode G1 of the driving TFT T1. The compensation TFT T3 is turned on by the second scan signal $S_{n'}$ received through the second scan line 153 and electrically connects the driving gate electrode G1 and the driving drain electrode D1 of the driving TFT T1, thereby having the driving TFT T1 diode-connected.

A first initialization gate electrode G4 of the first initialization TFT T4 is connected to the previous scan line 151. A first initialization source electrode S4 of the first initialization TFT T4 is connected to a second initialization source electrode S7 and the initialization voltage line 141 of the second initialization TFT T7. The first initialization drain electrode D4 of the first initialization TFT T4 is connected to the lower electrode C1 of the storage capacitor Cst, the compensation source electrode S3 of the compensation TFT T3, and the driving gate electrode G1 of the driving TFT T1. The first initialization TFT T4 is turned on by the previous scan signal $S_{n-1}$ and performs an initialization operation to initialize a voltage of the driving gate electrode G1 of the driving TFT T1 by transmitting the initialization voltage Vint to the driving gate electrode G1 of the driving TFT T1.

An operation control gate electrode G5 of the operation control TFT T5 is connected to the emission control line 133. An operation control source electrode S5 of the operation control TFT T5 is connected to the driving voltage line 165. An operation control drain electrode D5 of the operation control TFT T5 is connected to the driving source electrode S1 of the driving TFT T1 and the switching drain electrode D2 of the switching TFT T2.

An emission control gate electrode G6 of the emission control TFT T6 is connected to the emission control line 133. An emission control source electrode S6 of the emission control TFT T6 is connected to the driving drain electrode D1 of the driving TFT T1 and the compensation drain electrode D3 of the compensation TFT T3. An emission control drain electrode D6 of the emission control TFT T6 is electrically connected to a second initialization drain electrode D7 of the second initialization TFT T7 and the pixel electrode of the OLED.

The operation control TFT T5 and the emission control TFT T6 are simultaneously turned on by the emission control signal $E_n$ received through the emission control line 133. Thus the driving voltage ELVDD is transmitted to the OLED and the driving current IOLED flows in the OLED.

A second initialization gate electrode G7 of the second initialization TFT T7 is connected to the next scan line 155. The second initialization drain electrode D7 of the second initialization TFT T7 is connected to the emission control drain electrode D6 of the emission control TFT T6 and the pixel electrode of the OLED. A second initialization source electrode S7 of the second initialization TFT T7 is connected to the first initialization source electrode S4 of the first initialization TFT T4 and the initialization voltage line 141. The second initialization TFT T7 is turned on by the next scan signal $S_{n+1}$ through the next scan line 155 and initializes the pixel electrode of the OLED.

FIG. 2 illustrates a case in which the second initialization TFT T7 is connected to the next scan line 155. Alternatively, the second initialization TFT T7 may be connected to the emission control line 133 and driven by the emission control signal $E_n$. The positions of the source electrodes S1 to S7 and the drain electrodes D1 to D4 of FIG. 2 may be switched according to the type of a transistor, i.e., a p-type or an n-type. A detailed operation of each pixel PX according an embodiment is described below.

During an initialization period, when the previous scan signal $S_{n-1}$ is supplied through the previous scan line 151, the first initialization TFT T4 is turned on in response to the previous scan signal $S_{n-1}$, the driving TFT T1 is initialized by the initialization voltage Vint supplied through the initialization voltage line 141.

During a data programming period, when the first scan signal $S_n$ and the second scan signal $S_{n'}$ are supplied through the first scan line 131 and the second scan line 153, the switching TFT T2 and the compensation TFT T3 are turned on in response to the first scan signal $S_n$ and the second scan signal $S_{n'}$. At this time, the driving TFT T1 is diode-connected by the compensation TFT T3 that is turned on, and is biased in a forward direction.

Then, a compensation voltage $D_m$+Vth, where the Vth is a minus (−) value, obtained by subtracting a threshold voltage Vth of the driving TFT T1 from the data signal $D_m$ of the data line 161, is applied to the driving gate electrode G1 of the driving TFT T1. A driving voltage ELVDD and the compensation voltage $D_m$+Vth are applied to both ends of the storage capacitor Cst, and electric charges, corresponding to a voltage difference between both ends, are stored in the storage capacitor Cst.

During an emission period, the operation control TFT T5 and the emission control TFT T6 are turned on by the emission control signal $E_n$ supplied through the emission control line 133. The driving current IOLED according to a voltage difference between the driving gate electrode G1 of the driving TFT T1 and the driving voltage ELVDD is generated, and the driving current IOLED is supplied to the OLED through and the emission control TFT T6.

In the present embodiment, at least one of the TFTs T1, T2, T3, T4, T5, T6, and T7 may include a semiconductor layer including oxide, and the others may include a semiconductor layer including silicon. In detail, a driving TFT that directly affects brightness of a display apparatus includes a semiconductor layer formed of polycrystal silicon having high reliability, thereby implementing a high resolution display apparatus.

Since an oxide semiconductor has high carrier mobility and low leakage current, a voltage drop is not much even when a driving time is long. In other words, since a color change of an image according to a voltage drop is not much during low frequency driving, low frequency driving is possible. As such, in the oxide semiconductor, since leakage current is small, by providing at least one of the compensation TFT T3, the first initialization TFT T4, and the second initialization TFT T7, which are connected to the driving gate electrode G1 of the driving TFT T1, as the oxide semiconductor, leakage current that may flow toward the driving gate electrode G1 may be prevented and simultaneously power consumption may be reduced.

Figure 3A:
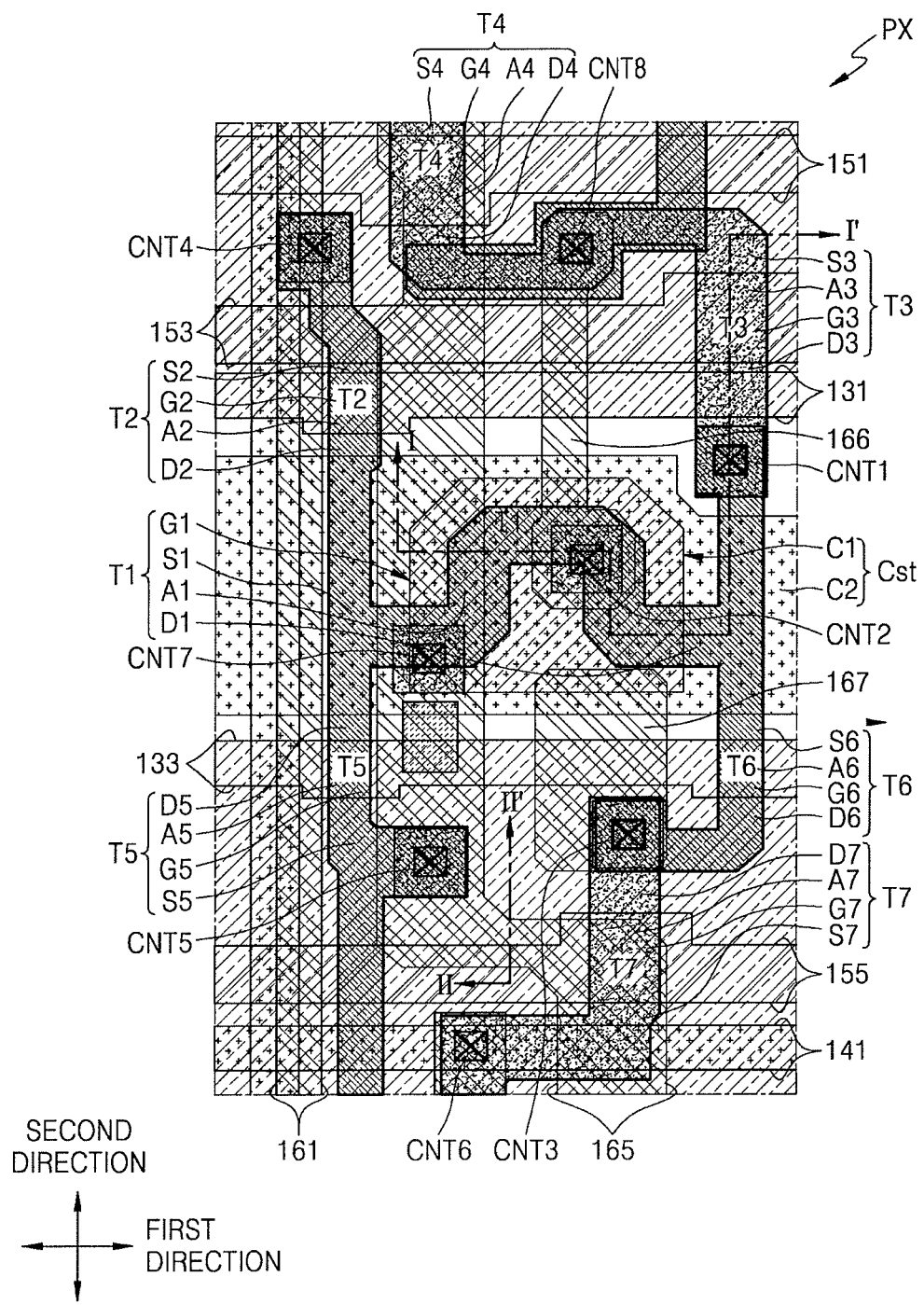
FIG. 3A illustrates a schematic layout of positions of a plurality of thin film transistors (TFTs) and a storage capacitor arranged in one pixel.
Figure 3B:
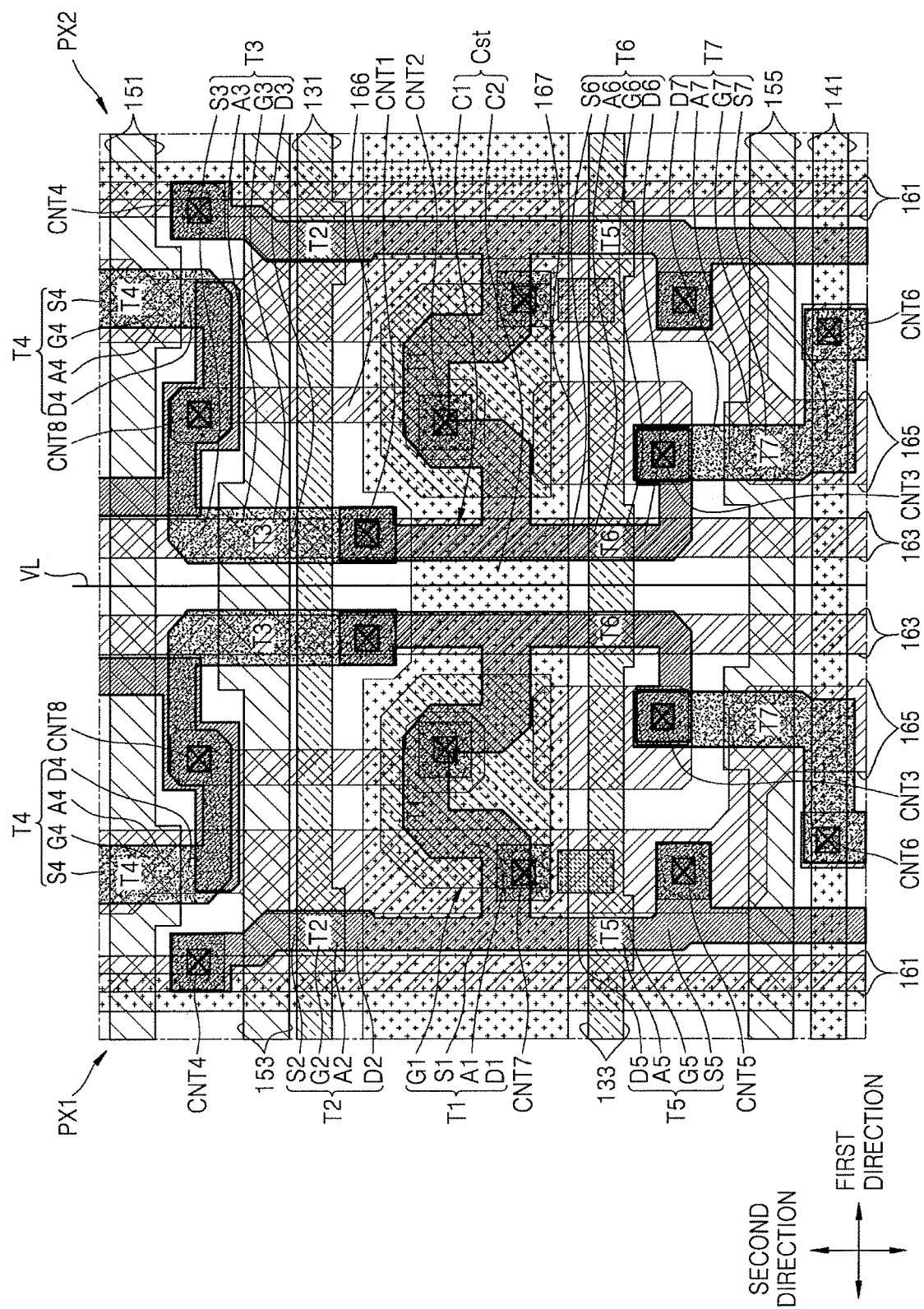
FIG. 3B illustrates schematic layout of positions of a plurality of TFTs and a storage capacitor arranged in two neighboring pixels.
Figure 4:
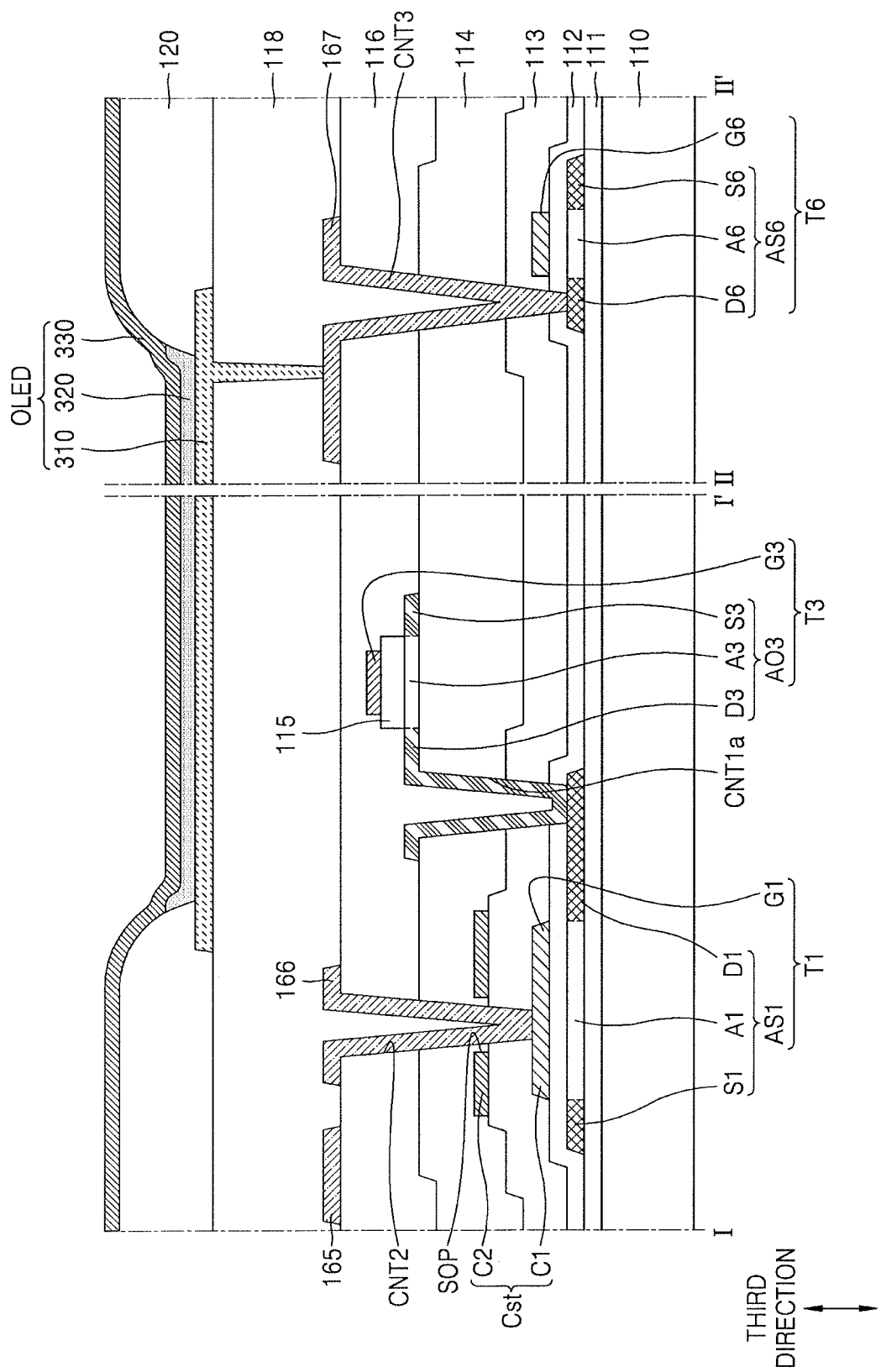
FIG. 4 illustrates a cross-sectional view taken along lines I-I' and II-II' of FIG. 3A.

FIG. 3A is a layout schematically illustrating positions of a plurality of thin film transistors and a storage capacitor arranged in one pixel. FIG. 3B is a layout schematically illustrating positions of a plurality of thin film transistors and a storage capacitor in two neighboring pixels. FIG. 4 is a cross-sectional view taken along lines I-I' and II-II' of FIG. 3A.

Referring to FIG. 3A, a pixel of the display apparatus according to an embodiment may include the first scan line 131, the second scan line 153, the previous scan line 151, the next scan line 155, the emission control line 133, and an initialization voltage line 141, which extend in a first direction, and the data line 161 and the driving voltage line 165, which extend in a second direction that intersects the first direction. Although FIG. 3A illustrates that only one data line 161 is provided in one pixel, as illustrated in FIG. 3B, an additional data line 163 extending in the second direction may be further provided in one pixel.

Furthermore, the pixel may include the driving TFT T1, the switching TFT T2, the compensation TFT T3, the first initialization TFT T4, the operation control TFT T5, the emission control TFT T6, the second initialization TFT T7, and the storage capacitor Cst. In the present embodiment, the driving TFT T1, the switching TFT T2, the operation control TFT T5, and the emission control TFT T6 each are a TFT including a silicon semiconductor. The compensation TFT T3, the first initialization TFT T4, and the second initialization TFT T7 each are as a TFT including an oxide semiconductor.

Semiconductor layers of the driving TFT T1, the switching TFT T2, the operation control TFT T5, and the emission control TFT T6 are on the same layer and include the same material. For example, the semiconductor layer may be formed of polycrystal silicon. The semiconductor layers of the driving TFT T1, the switching TFT T2, the operation control TFT T5, and the emission control TFT T6 may be on a buffer layer 111 (see FIG. 4) on the substrate 110. The semiconductor layers of the driving TFT T1, the switching TFT T2, the operation control TFT T5, and the emission control TFT T6 may be connected to one another and curved in various shapes.

Each of the semiconductor layers of the driving TFT T1, the switching TFT T2, the operation control TFT T5, and the emission control TFT T6 may include a channel area, and a source area and a drain area at both sides of the channel area. For example, the source area and the drain area may be doped with impurities, e.g. N-type impurities or P-type impurities. The source area and the drain area correspond to a source electrode and a drain electrode, respectively. In the following description, the source electrode and the drain electrode are respectively referred to as the source area and the drain area.

The driving TFT T1 may include a driving semiconductor layer and the driving gate electrode G1. The driving semiconductor layer may include a driving channel area A1, and a driving source area S1 and a driving drain area D1 at both sides of the driving channel area A1. The driving semiconductor layer may have a curved shape in plan view, and the driving channel area A1 may be longer than the other channel areas A2 to A7. For example, as the driving semiconductor layer has a multiply bent shape such as "Q" or "S", a long channel length may be realized in a narrow space. When the driving channel area A1 increases, a driving range of a gate voltage applied to the driving gate electrode G1 increases. Thus gradation of light emitted from the OLED may be more accurately controlled, thereby improving display quality. The driving gate electrode G1 is of an island type and overlaps the driving channel area A1 with a first gate insulating layer 112 (see FIG. 4) therebetween along a third direction that intersects the first and second directions.

The storage capacitor Cst overlaps the driving TFT T1. The storage capacitor Cst may include the lower electrode C1 and an upper electrode C2. The driving gate electrode G1 may function not only as the gate electrode of the driving TFT T1, but also as the lower electrode C1 of the storage capacitor Cst. In other words, the driving gate electrode G1 and the lower electrode C1 may be understood as one body. The upper electrode C2 of the storage capacitor Cst overlaps the lower electrode C1 with a second gate insulating layer 113 (see FIG. 4) therebetween along the third direction. In this state, the second gate insulating layer 113 may function as a dielectric layer of the storage capacitor Cst. The upper electrode C2 may have a storage opening portion SOP. The storage opening portion SOP may be formed by removing a part of the upper electrode C2, and may have a single closed curve shape in plan view. A node connection line 166 may be connected to the lower electrode C1 via a contact hole CNT2 provided in the storage opening portion SOP. The upper electrode C2 may be connected to the driving voltage line 165 via a seventh contact hole CNT7.

The switching TFT T2 may include a switching semiconductor layer and the switching gate electrode G2. The switching semiconductor layer may include a switching channel area A2, and a switching source area S2 and a switching drain area D2 at both sides of the switching channel area A2. The switching source area S2 is connected to the data line 161 via a fourth contact hole CNT4, and the switching drain area D2 is connected to the driving source area S1. The switching gate electrode G2 may be a part of the first scan line 131.

The operation control TFT T5 may include an operation control semiconductor layer and the operation control gate electrode G5. The operation control semiconductor layer may include an operation control channel area A5, and an operation control source area S5 and an operation control drain area D5 at both sides of the operation control channel area A5. The operation control source area S5 may be connected to the driving voltage line 165 via a fifth contact hole CNT5, and the operation control drain area D5 may be connected to the driving source area S1. The operation control gate electrode G5 may be a part of the emission control line 133.

The emission control TFT T6 may include an emission control semiconductor layer and the emission control gate electrode G6. The emission control semiconductor layer may include an emission control channel area A6, and an emission control source area S6 and an emission control drain area D6 at both sides of the emission control channel area A6. The emission control source area S6 may be connected to the driving drain area D1, and the emission control drain area D6 may be connected to a connection electrode 167 via a third contact hole CNT3. The connection electrode 167 may be connected to the pixel electrode 310 of the OLED (see FIG. 4). The emission control gate electrode G6 may be a part of the emission control line 133.

A first interlayer insulating layer 114 (see FIG. 4) may be on the TFTs T1, T2, T5, and T6 including a silicon semiconductor. The TFTs T3, T4, and T7 including an oxide semiconductor may be on the first interlayer insulating layer 114.

The semiconductor layers of the compensation TFT T3, the first initialization TFT T4, and the second initialization TFT T7 are arranged on the same layer and include the same material. For example, the semiconductor layers may be formed of an oxide semiconductor. The semiconductor layers may include a channel area, and a source area and a drain area at both sides of the channel area. For example, the source area and the drain area may be areas where carrier concentration is increased by plasma processing. The source area and the drain area correspond to a source electrode and a drain electrode, respectively. In the following description, the source electrode and the drain electrode are respectively referred to as the source area and the drain area.

The compensation TFT T3 may include a compensation semiconductor layer including an oxide semiconductor and the compensation gate electrode G3. The compensation semiconductor layer may include a compensation channel area A3, and a compensation source area S3 and a compensation drain area D3 at both sides of the compensation channel area A3. The compensation source area S3 may be bridge connected to the driving gate electrode G1 via the node connection line 166. One end of the node connection line 166 may be connected to the compensation source area S3 via an eighth contact hole CNT8, and the other end of the node connection line 166 may be connected to the driving gate electrode G1 via the second contact hole CNT2. Furthermore, the compensation source area S3 is connected to a first initialization semiconductor layer that is arranged on the same layer. The compensation drain area D3 may be connected to the driving semiconductor layer and the emission control semiconductor layer via the first contact hole CNT1. The compensation gate electrode G3 may be a part of the first scan line 131.

The first initialization TFT T4 may include the first initialization semiconductor layer AO4 including an oxide semiconductor and the first initialization gate electrode G4. The first initialization semiconductor layer may include a first initialization channel area A4, and a first initialization source area S4 and a first initialization drain area D4 at both sides of the first initialization channel area A4. The first initialization source area S4 may be connected to the initialization voltage line 141 via a sixth contact hole CNT6, and the first initialization drain area D4 may be bridge connected to the driving gate electrode G1 via the node connection line 166. The first initialization gate electrode G4 may be a part of the previous scan line 151.

The second initialization TFT T7 may include a second initialization semiconductor layer including an oxide semiconductor and a second initialization gate electrode G7. The second initialization semiconductor layer may include a second initialization channel area A7, and a second initialization source area S7 and a second initialization drain area D7 at both sides of the second initialization channel area A7. The second initialization source area S7 may be connected to the initialization voltage line 141 via the sixth contact hole CNT6, and the second initialization drain area D7 may be connected to the emission control drain area D6 via the third contact hole CNT3. The second initialization gate electrode G7 may be a part of the next scan line 155.

A third gate insulating layer 115 (see FIG. 4) may be between each of the compensation semiconductor layer and the compensation gate electrode G3, the first initialization semiconductor layer and the first initialization gate electrode G4, and the second initialization semiconductor layer and the second initialization gate electrode G7, to correspond to each channel area thereof. A second interlayer insulating layer 116 (see FIG. 4) may be arranged on the TFTs T3, T4, and T7 including an oxide semiconductor, as well as on the other TFTs. The data line 161 and the driving voltage line 165 may be on the second interlayer insulating layer 116.

In an embodiment, the first scan line 131 and the emission control line 133 may be on the same layer and may include the same material as the driving gate electrode G1. The initialization voltage line 141 may be on the same layer and may include the same material as the upper electrode C2 of the storage capacitor Cst. Furthermore, the data line 161, the driving voltage line 165, the node connection line 166, and the connection electrode 167 may be on the same layer and may include the same material. Alternatively, the initialization voltage line 141 may be arranged on the same layer as the driving gate electrode G1.

In a display apparatus according to another embodiment, a plurality of pixels may be arranged through a translational motion of the pixels PX of FIG. 3A having the same shape in the first and second directions. Alternatively, as illustrated in FIG. 3B, a display apparatus may include a second pixel PX2 having a shape symmetrical to a first pixel PX1 with respect to a virtual line VL, e.g., mirror symmetry. The virtual line VL may mean a line extending in the second direction between the first pixel PX1 and the second pixel PX2.

A structure of a display apparatus according to an embodiment is described according to a stacking order along the third direction below in detail with reference to FIG. 4. In FIG. 4, the structures of the driving TFT T1, the compensation TFT T3, the emission control TFT T6, and the storage capacitor Cst are mainly illustrated.

Referring to FIG. 4, a display apparatus according to an embodiment may include the substrate 110, the first TFT including a silicon semiconductor, the first interlayer insulating layer 114 covering the first TFT, and a second TFT including an oxide semiconductor. The first interlayer insulating layer 114 includes a contact hole corresponding to a portion of a first semiconductor layer, e.g., a source or drain region thereof. A portion of a second semiconductor layer of the second TFT extends into the contact hole to be connected to the first semiconductor layer of the first TFT. Furthermore, the display apparatus according to an embodiment may further include a third TFT. The first TFT may be the driving TFT T1, the second TFT may be the compensation TFT T3, and the third TFT may be the emission control TFT T6.

Furthermore, the display apparatus may further include a variety of insulating layers such as a buffer layer 111, the first gate insulating layer 112, the second gate insulating layer 113, a third gate insulating layer 115, the first interlayer insulating layer 114, the second interlayer insulating layer 116, and a planarized layer 118.

The substrate 110 may include a glass material, a ceramic material, a metal material, or a material having flexible or bendable properties. When the substrate 110 has flexible or bendable properties, the substrate 110 may include a polymer resin, e.g., polyethersulphone (PES), polyacrylate (PAR), polyetherimide (PEI), polyethylene napthalate (PEN), polyethylene terepthalate (PET), polyphenylene sulfide (PPS), polyallylate, polyimide (PI), polycarbonate (PC), cellulose acetate propionate (CAP), and the like. The substrate 110 may have a monolayer or multilayer structure including the above material. For a multilayer structure, the substrate 110 may further include an inorganic layer. In some embodiments, the substrate 110 may have a structure of an organic material/an inorganic material/an organic material.

The buffer layer 111 may increase smoothness of an upper surface of the substrate 110, and may be formed of an oxide film such as $SiO_x$ and/or a nitride film such as $SiN_x$. A barrier layer may be further provided between the substrate 110 and the buffer layer 111. The barrier layer may function to prevent or reduce intrusion of impurities from the substrate 110 into a silicon semiconductor layer. The barrier layer may include an inorganic material, e.g., oxide or nitride, an organic material, or an organic/inorganic composite, and may have a monolayer or multilayer structure including an inorganic material and an organic material.

A semiconductor layer including a silicon semiconductor, a driving semiconductor layer AS1, and an emission control semiconductor layer AS6 may be arranged on the buffer layer 111. The driving semiconductor layer AS1 may include the driving source area S1 and the driving drain area D1, which are doped with impurities to be conductive and are spaced apart from each other, with the driving channel area A1 there between. The driving source area S1 and the driving drain area D1 may correspond to the source electrode and the drain electrode of the driving TFT T1, respectively. The positions of the driving source area S1 and the driving drain area D1 may be switched with each other.

The emission control semiconductor layer AS6 may include the emission control source area S6 and the emission control drain area D6, which are doped with impurities to be conductive and are spaced apart from each other, and the emission control channel area A6 provided there between. The emission control source area S6 and the emission control drain area D6 may correspond to the source electrode and the drain electrode of the emission control TFT T6, respectively. The positions of the emission control source area S6 and the emission control drain area D6 may be switched with each other.

In the third direction, the driving gate electrode G1 overlaps the driving semiconductor layer AS1, e.g., the driving channel area A1, and the emission control gate electrode G6 overlaps the emission control semiconductor layer AS6, e.g., the emission control channel area A6. The first gate insulating layer 112 may be between the driving semiconductor layer AS1 and the driving gate electrode G1, and between the emission control semiconductor layer AS6 and the emission control gate electrode G6.

The first gate insulating layer 112 may include an inorganic material including oxide or nitride. For example, the first gate insulating layer 112 may include silicon oxide (SiO$_2$), silicon nitride (SiNx), silicon oxynitride (SiON), aluminum oxide (Al$_2$O$_3$), titanium oxide (TiO$_2$), tantalum oxide (Ta$_2$O$_5$), hafnium oxide (HfO$_2$), zinc oxide (ZnO$_2$), and the like. The driving gate electrode G1 may include molybdenum (Mo), copper (Cu), titanium (Ti), and the like and may have a monolayer or multilayer structure.

The storage capacitor Cst may be formed on and overlap the driving gate electrode G1. The storage capacitor Cst may include the lower electrode C1 and the upper electrode C2. The second gate insulating layer 113 may be between the lower electrode C1 and the upper electrode C2. The driving gate electrode G1 may function not only as a gate electrode of the driving TFT T1, but also the lower electrode C1 of the storage capacitor Cst. In other words, the driving gate electrode G1 and the lower electrode C1 may be understood as one body.

The second gate insulating layer 113 may include an inorganic material including oxide or nitride. For example, the second gate insulating layer 113 may include SiO$_2$, SiNx, SiON, Al$_2$O$_3$, TiO$_2$, Ta$_2$O$_5$, HfO$_2$, or ZnO$_2$.

The upper electrode C2 is on the second gate insulating layer 113 and overlaps the lower electrode C1 along the third direction. The upper electrode C2 may include the storage opening portion SOP. The storage opening portion SOP may have a shape of a single closed curve. The second contact hole CNT2 defined in the second gate insulating layer 113 may be in the storage opening portion SOP. The driving gate electrode G1 and the node connection line 166 may be connected to each other via the second contact hole CNT2. The upper electrode C2 may include Mo, Cu, Ti, and the like, and may have a monolayer or multilayer structure.

The first interlayer insulating layer 114 may be on the upper electrode C2. The first interlayer insulating layer 114 may include an inorganic material including oxide or nitride. For example, the first interlayer insulating layer 114 may include SiO$_2$, SiNx, SiON, Al$_2$O$_3$, TiO$_2$, Ta$_2$O$_5$, HfO$_2$, or ZnO$_2$.

A compensation semiconductor layer AO3 including an oxide semiconductor may be on the first interlayer insulating layer 114. The compensation semiconductor layer AO3 may include the compensation source area S3 and the compensation drain area D3, which are conductive and spaced apart from each other, with the compensation channel area A3 there between.

The compensation semiconductor layer AO3 may be formed of a Zn oxide-based material, e.g., Zn oxide, In—Zn oxide, or Ga—In—Zn oxide. In some embodiments, the compensation semiconductor layer AO3 may be IGZO (In—Ga—Zn—O), ITZO (In—Sn—Zn—O), or IGTZO (In—Ga—Sn—Zn—O) semiconductor, which is obtained by including metal such as indium (In), gallium (Ga), or tin (Sn) in ZnO.

The compensation source area S3 and the compensation drain area D3 may be formed to be conductive by adjusting the carrier concentration of the oxide semiconductor. For example, the compensation source area S3 and the compensation drain area D3 may be formed by increasing the carrier concentration through plasma processing performed on the oxide semiconductor using a hydrogen (H) based gas, a fluorine (F) based gas, a combination thereof, and the like. For example, the compensation source area S3 and the compensation drain area D3 may have a higher conductivity than the driving source area S1 and the driving drain area D1.

The compensation gate electrode G3 may overlap the compensation semiconductor layer AO3, e.g., the compensation source area A3, with the third gate insulating layer 115 provided therebetween. In FIG. 4, the width of the third gate insulating layer 115 is illustrated to be greater than the width of the compensation gate electrode G3. This may occur when the formation processes of the third gate insulating layer 115 and the compensation gate electrode G3 are performed separately. Alternatively, in one direction, e.g., the first or second directions, the width of the third gate insulating layer 115 and the width of the compensation gate electrode G3 may be formed substantially the same. For example, the third gate insulating layer 115 may be formed in the same mask process as the compensation gate electrode G3. Accordingly, the side surface of the third gate insulating layer 115 and the side surface of the compensation gate electrode G3 may be on the same plane.

The third gate insulating layer 115 may include an inorganic material including oxide or nitride. For example, the third gate insulating layer 115 may include SiO$_2$, SiNx, SiON, Al$_2$O$_3$, TiO$_2$, Ta$_2$O$_5$, HfO$_2$, or ZnO$_2$. The compensation gate electrode G3 may include Mo, Cu, or Ti, and have a monolayer or multilayer structure.

In the present embodiment, the compensation semiconductor layer AO3 of the compensation TFT T3 and the driving semiconductor layer AS1 of the driving TFT T1 may be connected to each other via the first contact hole CNT1. The first contact hole CNT1 penetrates through the first interlayer insulating layer 114. The first contact hole CNT1 may penetrate through the first interlayer insulating layer 114, the second gate insulating layer 113, and the first gate insulating layer 112, and expose a part of the driving semiconductor layer AS1. As a portion of the compensation semiconductor layer AO3, e.g., the compensation drain area D3 (or the compensation source area S3), extends into the first contact hole CNT1, the compensation semiconductor layer AO3 may be electrically connected to the driving semiconductor layer AS1.

In FIG. 4, as the compensation drain area D3 of the compensation semiconductor layer AO3 extends into the first contact hole CNT1 to directly contact the driving drain area D1 of the driving semiconductor layer AS1, the compensation TFT T3 and the driving TFT T1 may be electrically connected to each other. Alternatively, the compensation source area S3 of the compensation semiconductor layer AO3 may extend into the first contact hole CNT1, or an area exposed by the first contact hole CNT1 may become the driving source area S1. Furthermore, a metal layer other than the compensation semiconductor layer AO3 may be further provided in the first contact hole CNT1.

The compensation source area S3 or the compensation drain area D3 of the compensation semiconductor layer AO3 is an area that is made conductive through plasma processing performed on the oxide semiconductor, and the properties thereof may be very similar to those of metal. Accordingly, the driving source area S1 or the driving drain area D1, and the compensation source area S3 or the compensation drain area D3, may have low contact resistance even when contacting each other.

The second interlayer insulating layer 116 may cover TFTs that have an oxide semiconductor, e.g., the compensation TFT T3. The second interlayer insulating layer 116 may be on the compensation gate electrode G3, and the driving voltage line 165, the node connection line 166, and the connection electrode 167 may be on the second interlayer insulating layer 116.

The second interlayer insulating layer 116 may include an inorganic material including oxide or nitride. For example, the third gate insulating layer 115 may include $SiO_2$, SiNx, SiON, $Al_2O_3$, $TiO_2$, $Ta_2O_5$, $HfO_2$, or $ZnO_2$. The driving voltage line 165, the node connection line 166, and the connection electrode 167 may include a material having high conductivity, e.g., metal, conductive oxide, and the like. For example, the driving voltage line 165, the node connection line 166, and the connection electrode 167 may include aluminum (Al), copper (Cu), or titanium (Ti) and have a monolayer or multilayer structure. In some embodiments, the driving voltage line 165, the node connection line 166, and the connection electrode 167 may have a trilayer of sequentially arranged titanium, aluminum, and titanium (Ti/Al/Ti).

One end of the node connection line 166 may be connected to the driving gate electrode G1 via the second contact hole CNT2. The second contact hole CNT2 penetrates through the second interlayer insulating layer 116 and the first interlayer insulating layer 114. The second contact hole CNT2 may expose the driving gate electrode G1 by penetrating through the second interlayer insulating layer 116, the first interlayer insulating layer 114, and the second gate insulating layer 113. As a part of the node connection line 166 extends into the second contact hole CNT2, the node connection line 166 may be electrically connected to the driving gate electrode G1.

As the second contact hole CNT2 is apart from an edge of the storage opening portion SOP in the storage opening portion SOP of the upper electrode C2, the node connection line 166 extends into the second contact hole CNT2 may be electrically insulated from the upper electrode C2.

A part of the connection electrode 167 may be connected to the emission control semiconductor layer AS6 of the emission control TFT T6 via the third contact hole CNT3. The third contact hole CNT3 penetrates through the second interlayer insulating layer 116 and the first interlayer insulating layer 114. The third contact hole CNT3 may expose a part of the emission control semiconductor layer AS6 by penetrating through the second interlayer insulating layer 116, the first interlayer insulating layer 114, the second gate insulating layer 113, and the first gate insulating layer 112. As the part of the connection electrode 167 extends into the third contact hole CNT3, the connection electrode 167 may be electrically connected to the emission control semiconductor layer AS6.

In FIG. 4, as the part of the connection electrode 167 extends into the third contact hole CNT3 to directly contact the emission control drain area D6, the connection electrode 167 and the emission control TFT T6 may be electrically connected electrically connected. Alternatively, the connection electrode 167 may be connected to the emission control source area S6. Furthermore, an element other than the connection electrode 167 may be further provided in the third contact hole CNT3.

The connection electrode 167 is connected to the pixel electrode 310. Thus a signal applied through the emission control TFT T6 may be transmitted to the pixel electrode 310.

The planarized layer 118 may be on the node connection line 166, the driving voltage line 165, and the connection electrode 167. The planarized layer 118 may include an organic material, e.g., acryl, benzocyclobutene (BCB), polyimide, or hexamethyldisiloxane (HMDSO). Alternatively, the planarized layer 118 may include an inorganic material. The planarized layer 118 functions as a protection film covering the TFTs T1 to T7, and an upper surface of the planarized layer 118 may be flat. The planarized layer 118 may have a monolayer or multilayer structure.

The OLED having the pixel electrode 310, an opposite electrode 330, and an intermediate layer 320 therebetween and having an emission layer may be on the planarized layer 118. The pixel electrode 310 may be connected to the connection electrode 167 via a contact hole defined in the planarized layer 118 and, in turn, to the emission control drain area D6 of the emission control TFT T6.

A pixel defining layer 120 may be on the planarized layer 118. The pixel defining layer 120 has an opening corresponding to each pixel, i.e., an opening exposing at least a center portion of the pixel electrode 310, thereby defining a pixel. Furthermore, the pixel defining layer 120 may prevent generation of arc at an edge of the pixel electrode 310 by increasing a distance between the edge of the pixel electrode 310 and the opposite electrode 330 above the pixel electrode 310. The pixel defining layer 120 may be formed of an organic material, e.g., polyimide, HMDSO, and the like.

The intermediate layer 320 of the OLED may include a low molecule or polymer material. When a low molecule material is included, the intermediate layer 320 may include a hole injection layer (HIL), a hole transport layer (HTL), an emission layer (EML), an electron transport layer (ETL), and/or an electron injection layer (EIL), and may include various organic materials such as copper phthalocyanine (CuPc), N,N'-Di(naphthalene-1-yl)-N,N'-diphenyl-benzidine (NPB), or tris-8-hydroxyquinoline aluminum ($Alq_3$). These layers may be formed in a vacuum deposition method.

When the intermediate layer 320 includes a polymer material, the intermediate layer 320 may often have a structure including the HTL and the EML. In this state, the HTL may include poly(3,4-ethylenedioxythiophene) PEDOT, and the emission layer may include a poly-phenylenevinylene (PPV) based and polyfluorene based polymer material. The intermediate layer 320 may be formed by a screen printing method, an inkjet printing method, or a laser induced thermal imaging (LITI).

The intermediate layer 320 may have a variety of structures. The intermediate layer 320 may include an integrated layer across a plurality of pixel electrodes, or a patterned layer corresponding to each of the pixel electrodes.

The opposite electrode 330 may be integrally formed with respect to a plurality of OLEDs and may correspond to the pixel electrodes.

Since the OLED configured as above is easily damaged by external moisture or oxygen, a thin film encapsulation layer may be provided on the OLED to cover and protect the OLED. The thin film encapsulation layer may cover the display area DA and extend to the outside of the display area DA. The thin film encapsulation layer may include an inorganic encapsulation layer including at least one inorganic material and an organic encapsulation layer including at least one organic material. In some embodiments, the thin film encapsulation layer may have a stacked structure of a first inorganic encapsulation layer/an organic encapsulation layer/a second inorganic encapsulation layer.

Furthermore, a spacer for preventing mask scratches may be further provided on the pixel defining layer 120, and various functional layers, e.g., a touch screen layer having a polarized layer for reducing external light reflection, a black matrix, a color filter, and/or a touch electrode may be provided on the thin film encapsulation layer.

In the present embodiment, in order to connect the oxide semiconductor layer and the silicon semiconductor layer provided at different layers, a part of the oxide semiconductor layer extends into a contact hole that exposes a part of the silicon semiconductor layer. Accordingly, the display apparatus according to the present embodiments may implement a high resolution, which is described below with reference to FIG. 5.

Figure 5:
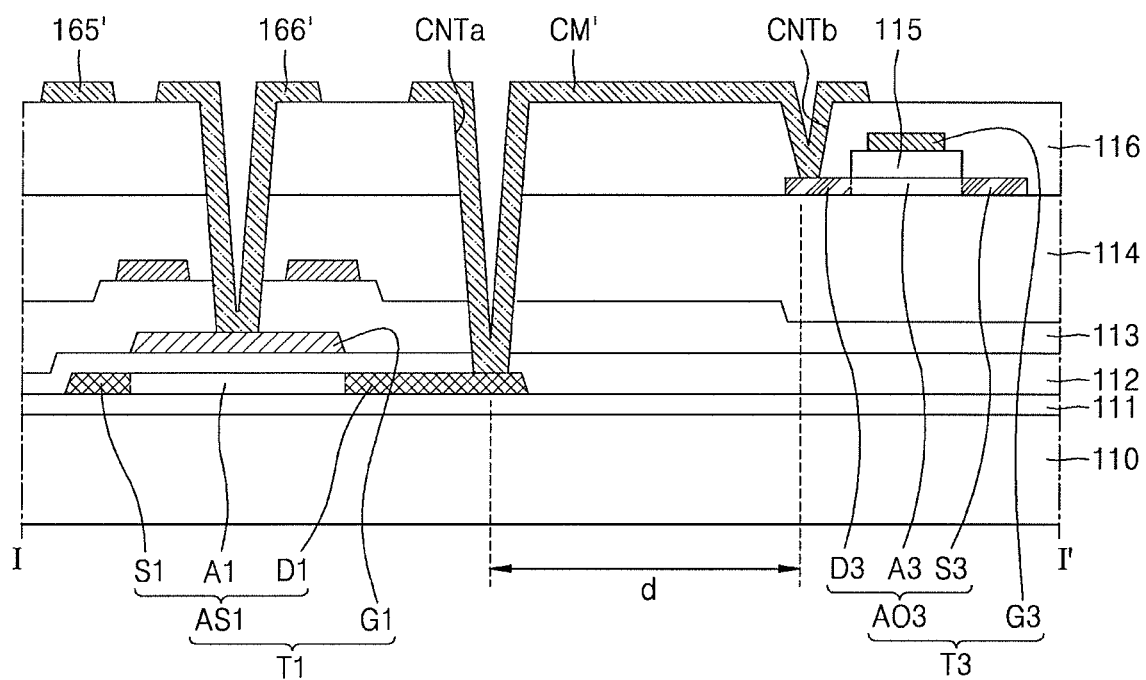
FIG. 5 illustrates a cross-sectional view of a comparative example for comparison with the present embodiments.

FIG. 5 is a cross-sectional view of a comparative example for comparison with the present embodiments. FIG. 5 illustrates a part of an area corresponding to I-I' of FIG. 4. In FIGS. 4 and 5, like reference numerals denote like elements FIG. 4.

Referring to FIG. 5, the compensation semiconductor layer AO3 including an oxide semiconductor and the driving semiconductor layer AS1 including a silicon semiconductor are connected by a bridge connection wiring CM'. In other words, one end of the bridge connection wiring CM' is connected to the driving drain area D1 of the driving semiconductor layer AS1 via a first bridge contact hole CNTa, and the other end of the bridge connection wiring CM' is connected to the compensation drain area D3 via a second bridge contact hole CNTb. In this state, the first bridge contact hole CNTa penetrates through the second interlayer insulating layer 116, the first interlayer insulating layer 114, the second gate insulating layer 113, and the first gate insulating layer 112, and exposes the part of the driving semiconductor layer AS1. The second bridge contact hole CNTb penetrates through the second interlayer insulating layer 116, and exposes the part of the compensation semiconductor layer AO3.

As such, when the compensation semiconductor layer AO3 and the driving semiconductor layer AS1 are connected to each other by the bridge connection wiring CM', a space for forming the first bridge contact hole CNTa and the second bridge contact hole CNTb, e.g., a separation distance d at which the first bridge contact hole CNTa and the second bridge contact hole CNTb are spaced apart from each other is created.

However, as in the present embodiment described with reference to FIG. 4, when the compensation semiconductor layer AO3 of the compensation TFT T3 and the driving semiconductor layer AS1 of the driving TFT T1 are connected to each other via one contact hole, that is, the first contact hole CNT1, the separation distance d is not needed. Thus, space occupied by a pixel circuit is reduced, thereby implementing high integration.

Furthermore, the bridge connection wiring CM' is arranged on the same layer as a driving voltage line 165'. When the bridge connection wiring CM' is not used to connect the oxide semiconductor layer and the silicon semiconductor layer, an additional width of the driving voltage line 165' may be secured.

Figure 6:
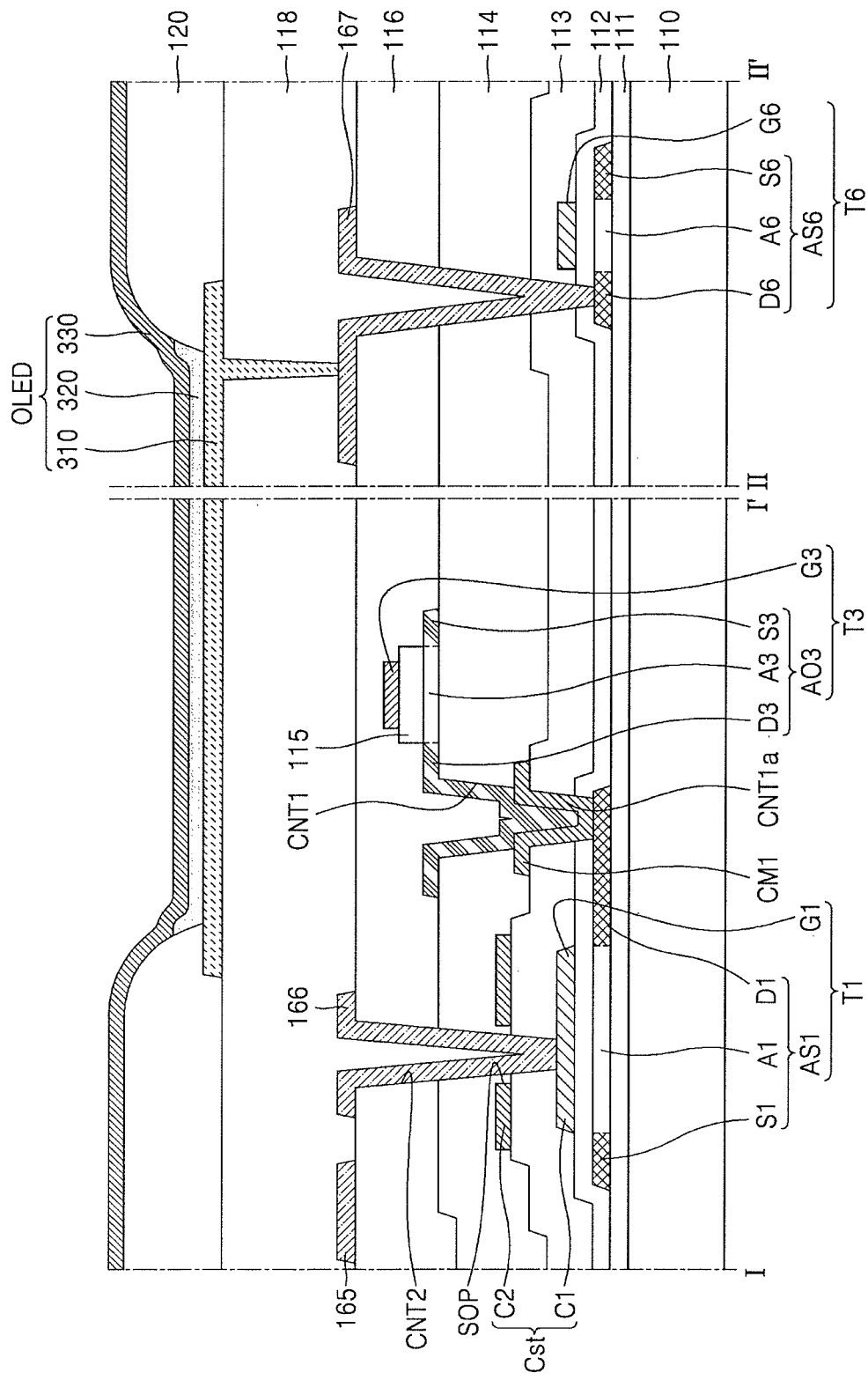
FIG. 6 illustrates a cross-sectional view of a display apparatus according to another embodiment.

FIG. 6 is a cross-sectional view of a display apparatus according to another embodiment. In FIGS. 4 and 6, like reference numerals denote like elements, and thus redundant descriptions thereof are omitted.

Referring to FIG. 6, the display apparatus according to the present embodiment may include the substrate 110, the first TFT including a silicon semiconductor, the first interlayer insulating layer 114 covering the first TFT, and the second TFT including an oxide semiconductor. A contact hole corresponding to a part of the first semiconductor layer is provided in the first interlayer insulating layer 114. A part of the second semiconductor layer of the second TFT extends into the contact hole and connected to the first semiconductor layer of the first TFT. Furthermore, the display apparatus according to the present embodiment may further include the third TFT. The first TFT may be the driving TFT T1, the second TFT may be the compensation TFT T3, and the third TFT may be the emission control TFT T6.

In the present embodiment, the compensation semiconductor layer AO3 of the compensation TFT T3 and the driving semiconductor layer AS1 of the driving TFT T1 may be connected to each other via the first contact hole CNT1. The first contact hole CNT1 penetrates through the first interlayer insulating layer 114 and a portion of the compensation semiconductor layer AO3 extends into the first contact hole CNT1.

The part of the compensation semiconductor layer AO3 that extends into the first contact hole CNT1, e.g., the compensation drain area D3, contacts a first lower connection electrode CM1. In other words, in the present embodiment, the first contact hole CNT1 corresponds to the first lower connection electrode CM1, and is arranged to expose the first lower connection electrode.

The first lower connection electrode CM1 is on the second gate insulating layer 113. The first lower connection electrode CM1 may include the same material as the upper electrode C2 of the storage capacitor Cst and may be on the same layer. The first lower connection electrode CM1 may include Mo, Cu, or Ti, and may have a monolayer or multilayer structure.

The first lower connection electrode CM1 may be connected to the part of the driving semiconductor layer AS1 via a first lower contact hole CNT1a. The first lower contact hole CNT1a penetrates through the second gate insulating layer 113, and may expose the part of the driving semiconductor layer AS1, for example, the driving drain area D1. The first lower connection electrode CM1 may extend into the first lower contact hole CNT1a to be in contact with the driving semiconductor layer AS1.

The first contact hole CNT1 and the first lower contact hole CNT1a may overlap each other along the third direction. Accordingly, a space for arranging the contact holes CNT1 and CNT1a may be reduced, thereby implementing high integration.

Furthermore, since the compensation semiconductor layer AO3 and the first lower connection electrode CM1 are connected to each other via the first contact hole CNT1, without the bridge wiring, the arrangement space of a pixel circuit may be reduced, thereby implementing high integration, and a sufficient width of the driving voltage line 165 may be secured.

Figure 7:
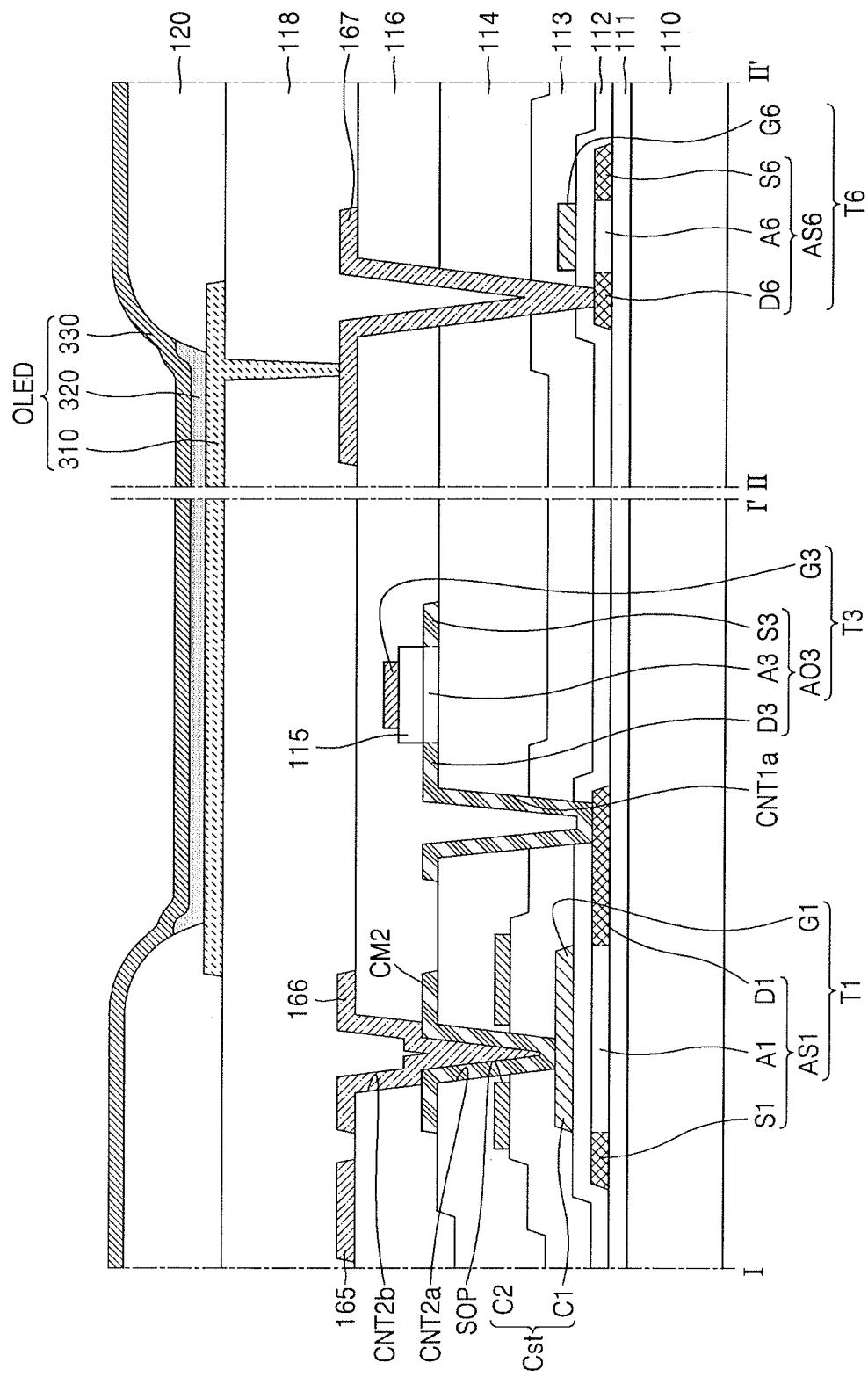
FIG. 7 illustrates a cross-sectional view of a display apparatus according to another embodiment.

FIG. 7 is a cross-sectional view of a display apparatus according to another embodiment. In FIGS. 4 and 7, like reference numerals denote like elements, and thus redundant descriptions thereof are omitted.

Referring to FIG. 7, the display apparatus according to the present embodiment may include the substrate 110, the first TFT including a silicon semiconductor, the first interlayer insulating layer 114 covering the first TFT, and the second TFT including an oxide semiconductor. A contact hole corresponding to a part of the first semiconductor layer is in the first interlayer insulating layer 114. A part of the second semiconductor layer of the second TFT extends into the contact hole and connected to the first semiconductor layer of the first TFT. Furthermore, the display apparatus according to the present embodiment may further include the third TFT. The first TFT may be the driving TFT T1, the second TFT may be the compensation TFT T3, and the third TFT may be the emission control TFT T6.

In the present embodiment, the node connection line 166 is connected to the driving gate electrode G1 via a second lower connection electrode CM2. The node connection line 166 extends into a second upper contact hole CNT2b that penetrates through the second interlayer insulating layer 116, to be in contact with the second lower connection electrode CM2. In other words, the second upper contact hole CNT2b is arranged corresponding to the second lower connection electrode CM2 to expose the second lower connection electrode CM2.

The second lower connection electrode CM2 is on the first interlayer insulating layer 114. The second lower connection electrode CM2 may be formed of the same material as the compensation source area S3 or the compensation drain area D3 of the compensation semiconductor layer AO3. The second lower connection electrode CM2 may be formed by making the oxide semiconductor conductive. For example, the second lower connection electrode CM2 may be formed of a Zn oxide-based material, for example, Zn oxide, In—Zn oxide, or Ga—In—Zn oxide. The second lower connection electrode CM2 may be formed by increasing carrier concentration through plasma processing performed on the oxide semiconductor using a hydrogen (H) based gas, a fluorine (F) based gas, or a combination thereof.

Since conductivity of the second lower connection electrode CM2 increases as the carrier concentration thereof increases, the second lower connection electrode CM2 may have the characteristics like metal. Thus, contact resistance to the driving gate electrode G1 may be low.

The second lower connection electrode CM2 may be connected to the driving gate electrode G1 via a second lower contact hole CNT2a. The second lower contact hole CNT2a penetrates through the first interlayer insulating layer 114 and the second gate insulating layer 113, and may expose the driving gate electrode G1. The second lower connection electrode CM2 may extend into the second lower contact hole CNT2a to be in contact with the driving gate electrode G1.

The second upper contact hole CNT2b and the second lower contact hole CNT2a may overlap along the third direction. Accordingly, a space for arranging the contact holes CNT2b and CNT2a may be reduced, thereby implementing high integration.

Figure 8:
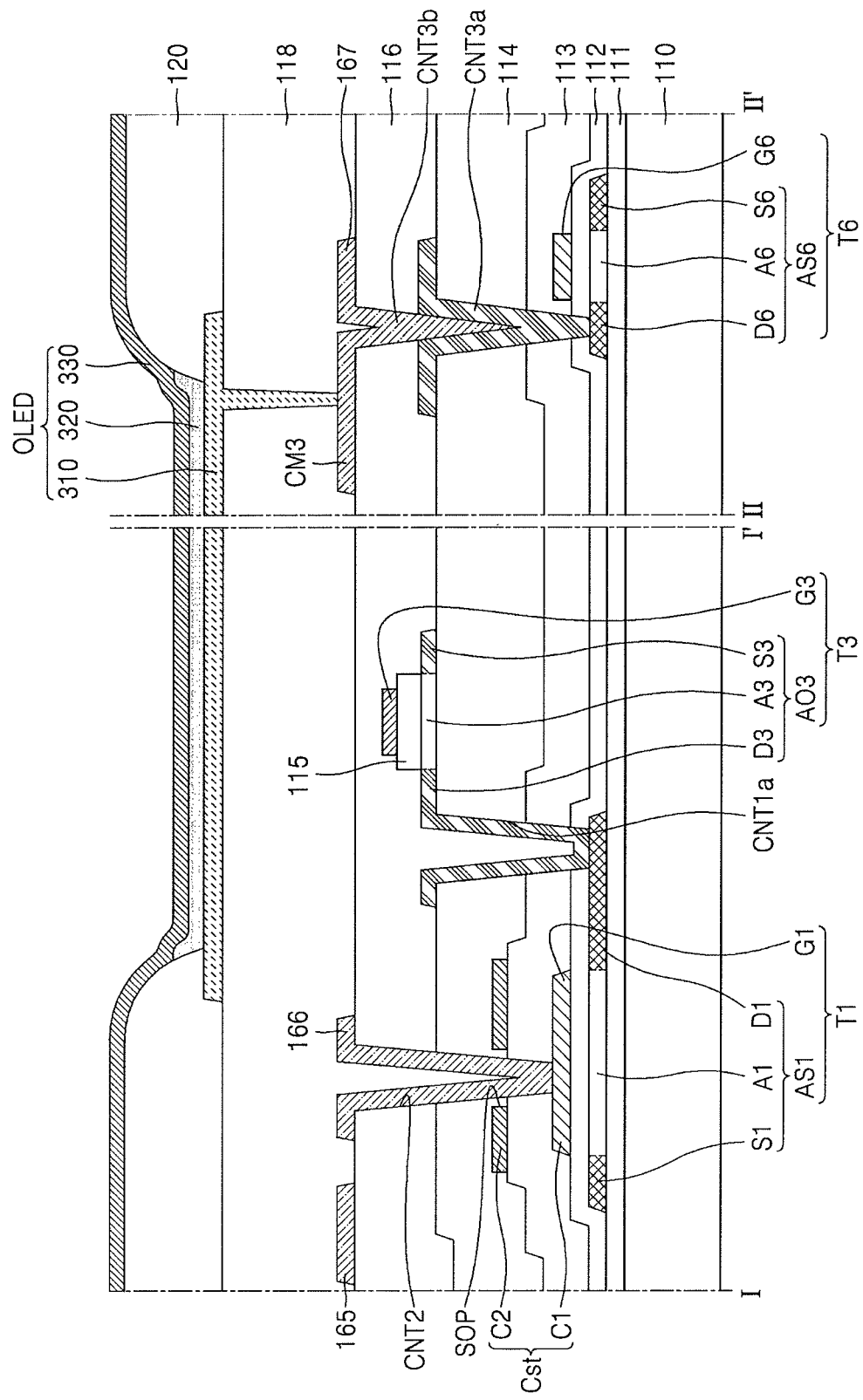
FIG. 8 illustrates a cross-sectional view of a display apparatus according to another embodiment.

FIG. 8 is a cross-sectional view of a display apparatus according to another embodiment. In FIGS. 4 and 8, like reference numerals denote like elements, and thus redundant descriptions thereof are omitted.

Referring to FIG. 8, display apparatus according to an embodiment may include the substrate 110, the first TFT including a silicon semiconductor, the first interlayer insulating layer 114 covering the first TFT, and the second TFT including an oxide semiconductor. A contact hole corresponding to a part of the first semiconductor layer is in the first interlayer insulating layer 114. A part of the second semiconductor layer of the second TFT extends into the contact hole and connected to the first semiconductor layer of the first TFT. Furthermore, the display apparatus according to the present embodiment may further include the third TFT. The first TFT may be the driving TFT T1, the second TFT may be the compensation TFT T3, and the third TFT may be the emission control TFT T6.

In the present embodiment, the connection electrode 167 is connected to the emission control semiconductor layer AS6 via a third lower connection electrode CM3. The connection electrode 167 extends into a third upper contact hole CNT3B that penetrates through the second interlayer insulating layer 116, to be in contact with the third lower connection electrode CM3. In other words, the third upper contact hole CNT3B may be arranged corresponding to the third lower connection electrode CM3 to expose the third lower connection electrode CM3.

The third lower connection electrode CM3 may be on the first interlayer insulating layer 114. The third lower connection electrode CM3 may be formed of the same material as the compensation source area S3 or the compensation drain area D3 of the compensation semiconductor layer AO3. The third lower connection electrode CM3 may be formed by making the oxide semiconductor conductive. For example, the third lower connection electrode CM3 may be formed of a Zn oxide-based material, for example, Zn oxide, In—Zn oxide, or Ga—In—Zn oxide, and may be formed by increasing carrier concentration through plasma processing performed on the oxide semiconductor using a hydrogen (H) based gas, a fluorine (F) based gas, or a combination thereof.

Since the conductivity of the third lower connection electrode CM3 increases the carrier concentration thereof increases, the third lower connection electrode CM3 may have the characteristics like metal. Thus, contact resistance to the emission control semiconductor layer AS6 may be low.

The third lower connection electrode CM3 may be connected to the emission control semiconductor layer AS6 via a third lower contact hole CNT3A. The third lower contact hole CNT3A penetrates through the first interlayer insulating layer 114, second gate insulating layer 113, and the first gate insulating layer 112, and may expose the emission control drain area D6 of the emission control semiconductor layer AS6. The third lower connection electrode CM3 may extend into the third lower contact hole CNT3A to be in contact with the emission control drain area D6.

The third upper contact hole CNT3B and the third lower contact hole CNT3A may overlap along the third direction. Accordingly, a space for arranging the contact holes CNT3B and CNT3A may be reduced, thereby implementing high integration.

Figure 9:
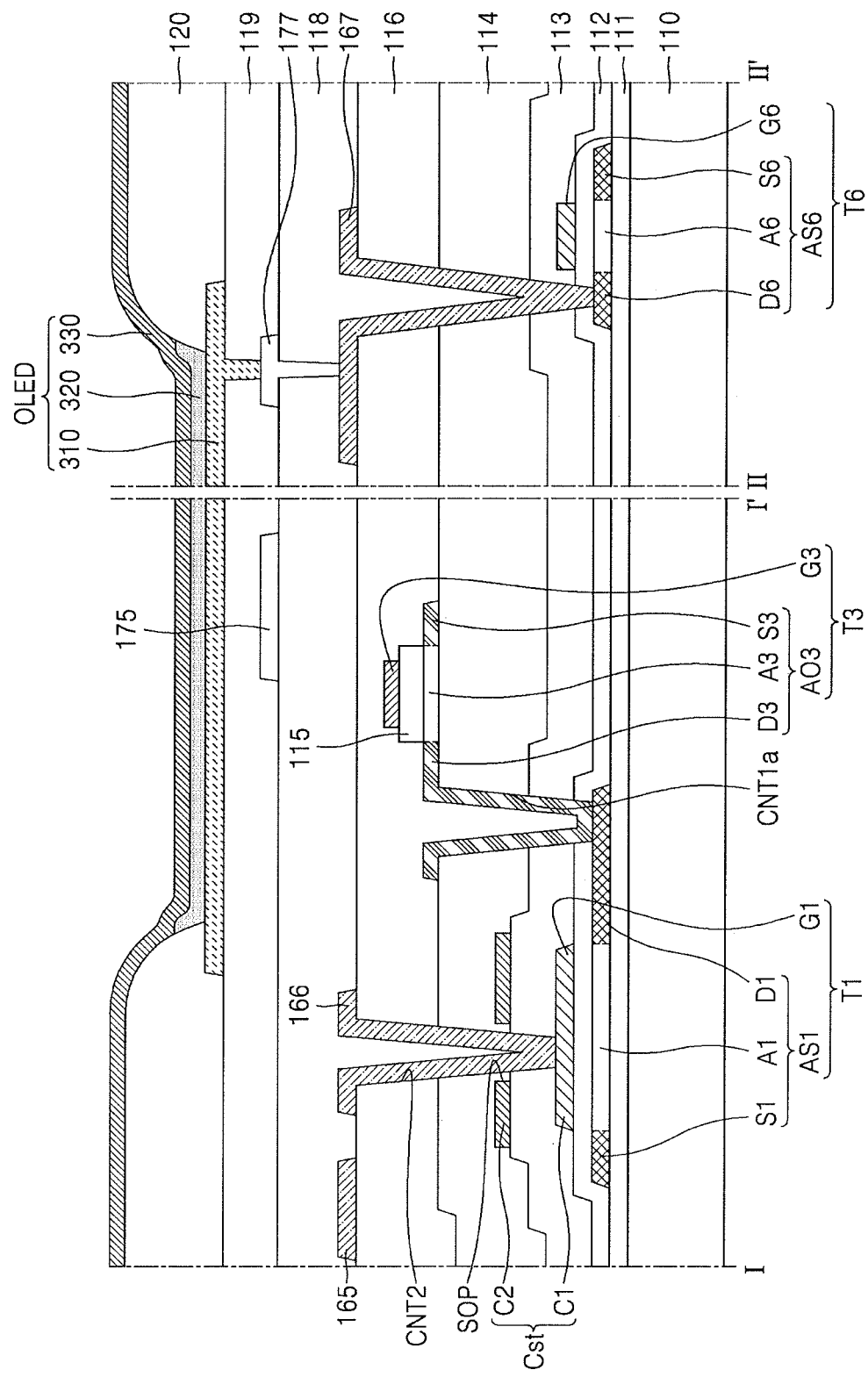
FIG. 9 illustrates a cross-sectional view of a display apparatus according to another embodiment.

FIG. 9 is a cross-sectional view of a display apparatus according to another embodiment. In FIGS. 4 and 9, like reference numerals denote like elements, and thus redundant descriptions thereof are omitted.

Referring to FIG. 9, the display apparatus according to the present embodiment may include the substrate 110, the first TFT including a silicon semiconductor, the first interlayer insulating layer 114 covering the first TFT, and the second TFT including an oxide semiconductor. A contact hole corresponding to a part of the first semiconductor layer is provided in the first interlayer insulating layer 114. A part of the second semiconductor layer of the second TFT extends into the contact hole and connected to the first semiconductor layer of the first TFT. Furthermore, the display apparatus according to the present embodiment may further include the third TFT. The first TFT may be the driving TFT T1, the second TFT may be the compensation TFT T3, and the third TFT may be the emission control TFT T6.

The compensation semiconductor layer AO3 of the compensation TFT T3 and the driving semiconductor layer AS1 of the driving TFT T1 may be connected to each other via the first contact hole CNT1. The first contact hole CNT1 penetrates through the first interlayer insulating layer 114. The part of the compensation semiconductor layer AO3 extends into the first contact hole CNT1.

In the present embodiment, the first planarized layer 118 is on the node connection line 166, the driving voltage line 165, and the connection electrode 167. The first planarized layer 118 may include an organic material, e.g., acryl, BCB, polyimide, HMDSO, and the like. Alternatively, the first planarized layer 118 may include an inorganic material. The first planarized layer 118 may function as a protection film covering the TFTs T1 to T7, and an upper surface of the first planarized layer 118 may be flat. The first planarized layer 118 may have a monolayer or multilayer structure.

An upper wiring 175 and an upper connection electrode 177 may be arranged on the first planarized layer 118. The upper wiring 175 may function as a driving voltage line for transmitting a driving voltage, or as a data line for transmitting a data signal. The upper connection electrode 177 may be connected to a connection electrode 167 via a contact hole defined in the first planarized layer 118. The upper wiring 175 and the upper connection electrode 177 may include a metal and conductive material. For example, the upper wiring 175 and the upper connection electrode 177 may include Al, Cu, or Ti, and may have a monolayer or multilayer structure. As the upper wiring 175 is provided, the data signal or the driving voltage may be transmitted through various routes, and interference between wirings may be reduced.

A second planarized layer 119 may be arranged covering the upper wiring 175 and the upper connection electrode 177. The second planarized layer 119 may include an organic material such as acryl, BCB, polyimide, HMDSO, and the like. Alternatively, the first planarized layer 118 may include an inorganic material. An upper surface of the second planarized layer 119 may be flat. The second planarized layer 119 may have a monolayer or multilayer structure. The OLED including the pixel electrode 310, the opposite electrode 330, and the intermediate layer 320 therebetween and having an emission layer may be provided on the second planarized layer 119.

According to the embodiments of the present disclosure, since a silicon semiconductor having superior reliability used as a semiconductor layer is employed in the driving TFT T1, and an oxide semiconductor having a low leakage current used as a semiconductor layer is employed in at least one other TFT, a display apparatus having high reliability and superior power consumption may be provided.

Furthermore, the compensation semiconductor layer AO3 including an oxide semiconductor and the driving semiconductor layer AS1 including a silicon semiconductor are connected to each other via the first contact hole CNT1, not through the bridge wiring. Thus, the arrangement space of a pixel circuit may be reduced, thereby implementing high integration, and the width of the driving voltage line 165 may be sufficiently secured.

As described above, according to the above-described embodiments, since the driving circuit for driving a display device includes the first TFT including a silicon semiconductor and the second TFT including an oxide semiconductor, a high resolution display apparatus having low power consumption may be provided.

Furthermore, since the second semiconductor layer including an oxide semiconductor and the first semiconductor layer including a silicon semiconductor, which are arranged on different layers, are connected to each other via the first contact hole, not through the bridge wiring, the arrangement space of a pixel circuit may be reduced, thereby implementing high integration.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
   a substrate;
   a scan line extending in a first direction on the substrate;
   a data line extending in a second direction crossing the first direction; and
   a first pixel circuit and a second pixel circuit disposed adjacently along the first direction, each of the first pixel circuit and the second pixel circuit, comprising:
   a first thin film transistor (TFT) and a second TFT having a silicon semiconductor; and
   a third TFT having an oxide semiconductor,
   wherein each of the first TFT, the second TFT, and the third TFT of the first pixel circuit is arranged symmetrically to each of the first TFT, the second TFT, and the third TFT of the second pixel circuit with respect to a virtual line extending in the second direction.

2. The display apparatus as claimed in claim 1, wherein a first semiconductor layer of the first TFT is integral with a second semiconductor layer of the second TFT, a third semiconductor layer of the third TFT is disposed on a layer different from the first semiconductor layer.

3. The display apparatus as claimed in claim 2, wherein one end of the first semiconductor layer connects to the third semiconductor layer through a contact hole.

4. The display apparatus as claimed in claim 2, wherein the first semiconductor has a bent portion.

5. The display apparatus as claimed in claim 1, further comprising a storage capacitor that overlaps the first TFT.

6. The display apparatus as claimed in claim 5, wherein one electrode of the storage capacitor is integral with a first gate electrode of the first TFT.

7. The display apparatus as claimed in claim 1, wherein the third TFT is closer to the virtual line than the second TFT in a plan view.

8. The display apparatus as claimed in claim 1, wherein the first TFT is closer to the virtual line than the second TFT in a plan view.

9. The display apparatus as claimed in claim 1, wherein a first interlayer insulating layer is disposed between the first semiconductor layer of the first TFT and the third semiconductor layer of the third TFT.

10. The display apparatus as claimed in claim 9, wherein a portion of the third semiconductor layer extends into the first contact hole and is connected to the first semiconductor layer.

* * * * *